United States Patent
Minnis et al.

(10) Patent No.: US 7,970,362 B2
(45) Date of Patent: Jun. 28, 2011

(54) RF TRANSMITTER WITH COMPENSATION OF DIFFERENTIAL PATH DELAY

(75) Inventors: Brian Minnis, Crawley (GB); Paul A. Moore, Seaford (GB)

(73) Assignee: NXP B.V., Eindhoven (NL)

( * ) Notice: Subject to any disclaimer, the term of this patent is extended or adjusted under 35 U.S.C. 154(b) by 695 days.

(21) Appl. No.: 11/996,329

(22) PCT Filed: Jul. 26, 2006

(86) PCT No.: PCT/IB2006/052560
§ 371 (c)(1),
(2), (4) Date: Jun. 2, 2008

(87) PCT Pub. No.: WO2007/013034
PCT Pub. Date: Feb. 1, 2007

(65) Prior Publication Data
US 2008/0242246 A1    Oct. 2, 2008

(30) Foreign Application Priority Data

Jul. 27, 2005    (EP) .................................... 05106901

(51) Int. Cl.
*H04B 1/04*    (2006.01)
*H04K 3/00*    (2006.01)

(52) U.S. Cl. ..................... 455/126; 455/127.1; 330/280; 330/296

(58) Field of Classification Search .................. 455/116, 455/126, 127.1–127.3; 330/280, 296; 375/296, 375/297
See application file for complete search history.

(56) References Cited

U.S. PATENT DOCUMENTS

| | | | |
|---|---|---|---|
| 5,420,536 A | 5/1995 | Faulkner et al. | |
| 6,025,754 A | 2/2000 | Czora | |
| 6,049,703 A | 4/2000 | Staudinger et al. | |
| 2004/0219891 A1 | 11/2004 | Hadjichristos | |
| 2005/0079835 A1 | 4/2005 | Takabayashi et al. | |

FOREIGN PATENT DOCUMENTS

| | | |
|---|---|---|
| JP | 2004356835 A | 12/2004 |
| WO | 2006017202 A1 | 2/2006 |

*Primary Examiner* — Lee Nguyen

(57) ABSTRACT

A transmitter has a power amplifier (40) to amplify an input signal having amplitude modulation, a supply voltage controller (10) to control a supply voltage of the power amplifier (40) according to the envelope, a sensor (R1) for sensing a modulation of a current drawn by the power amplifier (40), a delay detector (20) for detecting a delay of the controlled supply voltage relative to the sensed current, and a delay adjuster (30) for compensating the relative delay according to the detected delay. By sensing a current drawn, the delay detected can include any delay contributed by the power amplifier (40) up to that point, and yet avoid the more complex circuitry needed to derive the delay from an output of the power amplifier. Thus the distortion and out of band emissions caused by differential delays can be reduced more effectively.

13 Claims, 3 Drawing Sheets

RF TRANSMITTER WITH COMPENSATION OF DIFFERENTIAL PATH DELAY

This invention relates to a transmitter, to an integrated circuit, and to a device having the same, and to a method of operating such a transmitter.

Radio communication systems have traditionally made widespread use of constant-envelope modulation schemes, as these allow transmitters to use saturated power amplifiers, providing high efficiency and long battery life. However, in the interests of improved spectral efficiency, radio communication systems are increasingly moving towards the use of non-constant-envelope modulation schemes. On the basis of conventional wisdom, these call for the use of linear power amplifiers, reducing efficiency and shortening battery life. As this is unattractive, more advanced transmitter architectures can be used to recover these losses. Polar modulation is probably the best known of these, but envelope tracking is also gaining in popularity. With polar modulation, a saturated power amplifier is used, driven by a constant-envelope signal that contains just the phase component of the fully-modulated signal. The amplitude component of the fully-modulated signal is then introduced, at high level, by modulating the collector or drain supply voltage of the final transistor in the power amplifier with the envelope of the fully-modulated signal.

With envelope tracking, a linear power amplifier is used, driven by the fully-modulated signal, in the usual way. The envelope of the fully-modulated signal is also used to vary the collector or drain supply voltage of the final transistor in the power amplifier, as with polar modulation. But, as the power amplifier is linear, this does not introduce any amplitude modulation of the output signal, as this is neither required, nor desirable. Its sole purpose is to ensure that the final transistor is supplied with just the minimum supply voltage needed to prevent it from saturating, given the instantaneous value of the amplitude component of the fully-modulated drive signal.

Both techniques deliver maximum benefit when the collector or drain supply voltage of the final transistor in the power amplifier is set by means of a DC/DC converter. Polar modulation has the potential to deliver the higher improvement in efficiency but, as it uses a saturated power amplifier, it places the greater demand on the degree of cleanliness needed at the output the DC/DC converter. Envelope tracking looks rather more attractive, in this respect.

One of the most serious problems with both polar modulation and envelope tracking is the need to minimise any differential delay between the main signal path and the path carrying the envelope of the fully-modulated signal, to avoid spectral splatter. And, as these paths involve different types of signal processing, this is not something that can be readily achieved through the exploitation of the good relative match that normally exists between nominally-identical components in typical integrated circuit processes. With most non-constant-envelope modulation schemes, the width of the spectrum of both the envelope of the fully-modulated signal and the constant-envelope signal that contains just the phase component of the fully-modulated signal is typically ten times greater than that of the fully-modulated signal, itself. Each of these signals therefore has the potential to cause severe spectral splatter and, with polar modulation, it is only by minimising any differential delay between them that the width of the spectrum of the output signal finally collapses to that of the fully-modulated signal. The maximum differential delay that can be tolerated is typically one-tenth of the bit or chip period, as the case may be. With envelope tracking, differential delay still leads to spectral splatter, though the mechanism by which this occurs is entirely different. Firstly, the power amplifier is driven by the fully-modulated signal, itself, and not the constant-envelope signal that contains just the phase component of the fully modulated signal, so the width of the spectrum of the output signal starts off by being correct. Secondly, even though the envelope of the fully-modulated signal is also used to vary the collector or drain supply voltage of the final transistor in the power amplifier, the power amplifier is linear, so this does not introduce any amplitude modulation of the output signal. The width of its spectrum is therefore of no direct significance. Nevertheless, if a differential delay is introduced between the two signals, there will be times when the collector or drain of the final transistor in the power amplifier will be supplied with greater supply voltage than is needed to prevent it from saturating, which reduces efficiency, and other times when it will be supplied with insufficient supply voltage to prevent it from saturating. It is the resultant clipping of the output signal that leads to spectral splatter, in this case.

Known methods of minimising the differential delay between the main signal path and the path carrying the envelope of the fully-modulated signal involve enclosing the entire transmitter within a loop. In effect, this calls for a receiver, monitoring the output signal, to detect when spectral splatter has occurred. Whilst this has the advantage of measuring the extent of the problem, at source, it has the disadvantage of being expensive, both in terms of chip area and power consumption, which can nullify the point of using polar modulation or envelope tracking to raise efficiency.

It is known from US patent application 2005/0079835 to provide a transmitter in which a voltage of a power amplifier is controlled in response to an envelope amplitude of a transmission signal, and a delay of the control is automatically adjusted. The adjustment is made such that an out-of-band distortion component of a transmission signal is minimized, and a correct timing is produced. A delay means adjusts a control timing of a voltage that controls a power amplifying means, based on feedback from a distributor fed by an output from the power amplifying means. A distortion adjusting means calculates a distortion component of the amplified transmission signal by using the signal fed back by the distributor, and adjusts automatically a delay amount of the delay means so as to minimize the distortion component. This eliminates manual adjustment, and obtains high efficiency with less distortion. This is applied to transmitters where only the phase information is fed to the input of the power amplifier, or to transmitters where both amplitude and phase information is fed to the input.

In US application 2004/0219891, a polar modulation transmitter with a delay control feedback loop is shown. The feedback includes a receiver with a circuit for measuring adjacent channel power and deriving a delay control signal from this measurement.

It is an object of the invention to provide improved apparatus or methods.

According to a first aspect of the invention, there is provided a transmitter having a power amplifier arranged to amplify an input signal having at least some amplitude modulation, a supply voltage controller arranged to control a supply voltage of the power amplifier according to an envelope of the input signal, and a delay adjuster for compensating a relative delay between the input signal and the controlled supply voltage according to the delay detected by a delay detector, wherein the transmitter has a sensor for sensing a modulation of a current drawn by the power amplifier, and the delay detector is arranged to detect a delay of the controlled supply voltage relative to the sensed modulation of current.

By sensing a current drawn, the delay detected can include any delay contributed by the power amplifier up to that point, and yet avoid the more complex circuitry needed to derive the delay from an output of the power amplifier. Thus the distortion and out of band emissions caused by differential delays can be reduced more effectively.

Other aspects include a corresponding integrated circuit, a corresponding mobile battery powered device and a corresponding method.

Additional features and advantages will be described below. Any of the additional features can be combined together or with any of the aspects of the invention, as would be apparent to those skilled in the art. Other advantages may be apparent to those skilled in the art, especially over other prior art not known to the inventors.

Embodiments of the invention will now be described by way of example, and with reference to the accompanying drawings, in which.

The embodiments described provide a means for detecting the existence of any delay between the main signal path and the path carrying the envelope of the fully-modulated signal without having to down-convert the output signal. With envelope tracking, this is possible because the power amplifier is driven by the fully-modulated signal, rather than the constant-envelope signal that contains just the phase component of the fully-modulated signal. In the same way, the embodiments can extend to polar modulation, provided there is some modulation in the signal amplified, such as a very small fraction of the envelope of the drive signal. In principle, the modulations in the voltage and current used for detecting the delay could be created specifically for the purpose rather than using the amplitude modulations from the information content of the signal being transmitted. Any type of added modulation could be used on the drive signal and the supply voltage, not just amplitude modulation, provided it enables the relative delay to be measured, and does not pollute the desired output spectrum unduly, nor interfere with the information being carried. An example of such a modulation would be a pseudo random sequence of transitions between two or more slightly different power levels. A correlator could be used to detect the relative delay.

With envelope tracking, a linear power amplifier is used, driven by the fully-modulated signal. As a result, the instantaneous value of the envelope of the radio-frequency current flowing in the collector or drain of the final transistor in the power amplifier will automatically be an accurate representation of the instantaneous value of the amplitude component of the fully-modulated signal that is being handled, at that point. Thus, when the envelope of the fully-modulated signal is also used to vary the collector or drain supply voltage, at the same point, all that is needed, to ensure that there is no differential delay between the two paths, is to adjust a delay, in either path, until the envelope of the radio-frequency current and the supply voltage are in phase. If the adjuster is in the path having a greater intrinsic delay, then an additional fixed delay could be placed in the other path so that an increase in the delay applied by the adjuster can reduce the relative delay to implement the compensation.

Figure 1:
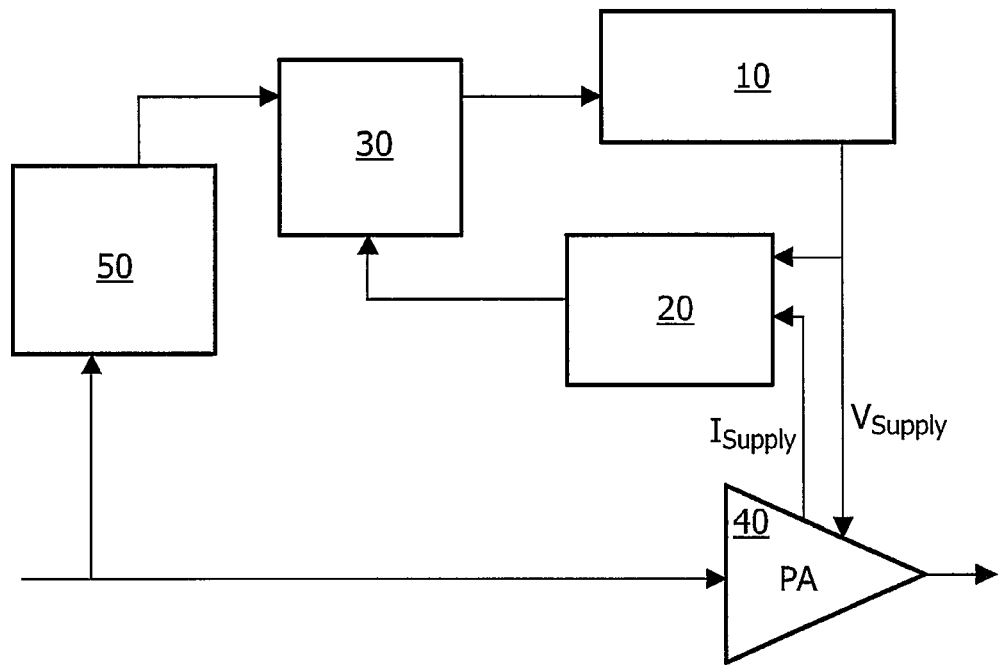
FIG. 1 shows a schematic view of a transmitter according to a first embodiment.

FIG. 1 shows a schematic view of a first embodiment. This shows a power amplifier (PA) 40, typically an RF amplifier, such as a two stage amplifier having a driver stage and an output stage, though in principle it can be any amplifier. An input signal is amplified by the power amplifier 40, and output to an antenna or to other processing stages according to the application. A supply voltage $V_{supply}$ to the power amplifier 40 is supplied by a controller 10, typically a transistor circuit coupled to a power supply (not shown) such as a battery in the case of a mobile handset. This controller 10 can be implemented as a DC/DC converter, a linear regulator, or some combination, for example. The controller 10 alters the voltage supplied according to an envelope of the input signal. This is extracted from the input signal by an extractor 50. This can be implemented using conventional circuitry, as would be apparent to those skilled in the art, without need for more explanation.

A delay adjuster 30 is provided to compensate for any relative delay. This part can be provided in both or in either of the paths shown to the power amplifier 40. A delay detector 20 is provided to detect a relative delay between the current drawn by the power amplifier 40 and the voltage supplied to the power amplifier 40. An example of the delay detector 20 is described below in relation to FIG. 2. The detected relative delay is used as an input to the delay adjuster 30, to enable it to compensate for any relative delay. The delay adjuster 30 can be implemented using conventional circuitry. This can be in the digital or the analogue domain. The signal from the delay detector 20 may include sign information, in which case the delay adjuster 30 can use a straightforward proportional control, or more complex integral or derivative control if appropriate according to the dynamic nature of the relative delay being compensated. If the detected delay does not include a sign indicating whether the delay needs to be increased or decreased, then the delay adjuster 30 can be controlled to try various values to search for an optimum value. Many algorithms for such a search are known, and a suitable algorithm can be chosen according to the application and the dynamic nature of the relative delay, and can be implemented using conventional circuitry or in software using conventional languages and executed by conventional microprocessor circuitry for example.

Figure 2:
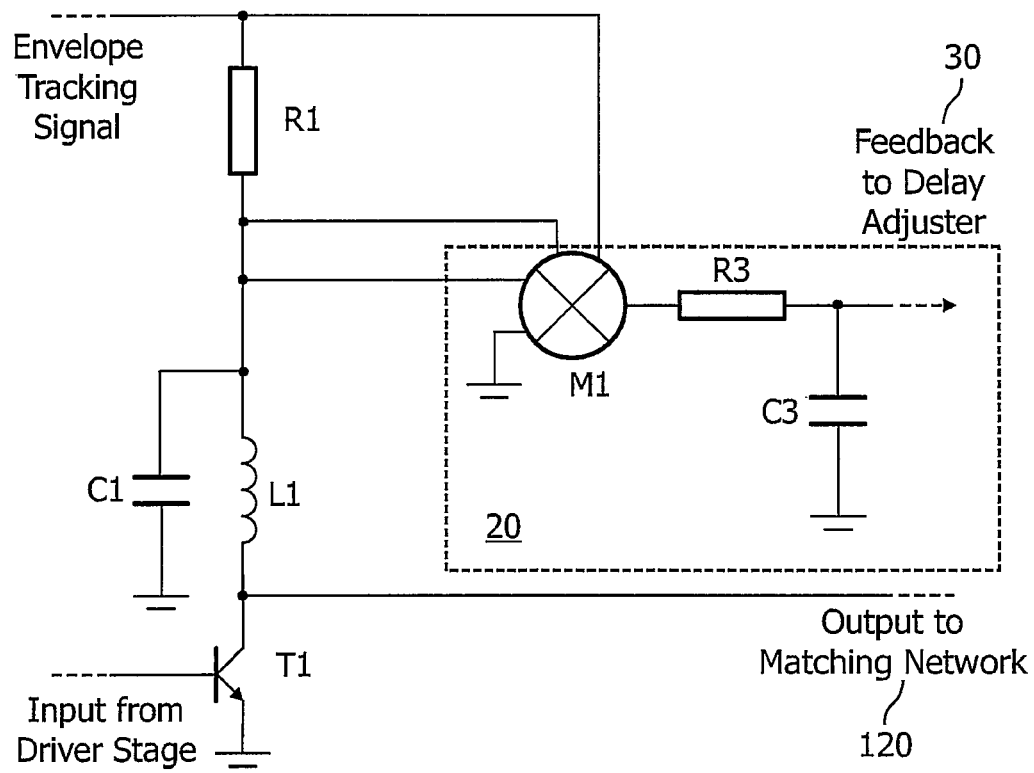
FIG. 2 shows a sensor and delay detector circuit according to an embodiment.

The delay detector 20 is fed by sensed values of modulations of the supply voltage and current. In a simple possible embodiment, the sensor can be implemented by placing a small sensing resistor R1 in series with the collector or drain of an output stage T1 of the power amplifier 40, as shown in FIG. 2. In the case of an RF power amplifier 40 operating in anything other than Class A, there may be no need to rectify the RF to extract the envelope, as the collector or drain current may already contain a component that is an adequate representation of the instantaneous value of the envelope of the fully-modulated signal. Such an output RF transistor T1 effectively acts as a partial rectifier of the current in addition to acting as an RF amplifier. For pure class A operation of the amplifier, there is no such envelope component evident in the collector or drain current because there is essentially no partial rectification effect. This means an external rectifier is needed to rectify the resulting RF voltage that is developed across the sensing resistor, to extract the envelope. An example is described below in relation to FIG. 4.

FIG. 2 shows an inductor L1 in the supply path in series with the sensing resistor R1. This is a conventional component for the purpose of ensuring RF does not leak back to the power supply. Capacitor C1 is provided to provide a ground path for any remaining RF. An alternative implementation would be to place the sensing resistor R1 in the supply path in series with the emitter or source of the output transistor T1. This may be convenient if there is already a series resistor for temperature stabilisation purposes which could also serve as a sensing resistor, provided any decoupling capacitor across it is dimensioned so as not to remove all the modulation needed for sensing.

In FIG. 2, the delay detector 20 is implemented using a multiplier M1 for multiplying the supply voltage $V_{supply}$ as represented by the voltage at the top of L1 as illustrated, referenced to ground, by a current drawn $I_{supply}$, represented by the voltage sensed across the sensing resistor R1. The multiplier M1 has an output which is a product of two modulations having a phase difference. The output has a DC component representing the phase difference, and a component at twice the frequency of the modulations. This component is removed by the low pass filter formed by series resistor R3 and parallel coupled capacitor C3, to leave a signal representing the relative delay. The sign of the output indicates whether the delay needs to be adjusted by an increase or decrease.

The delay adjuster 30 may typically integrate the delay signal over some suitable time period and adjust the delay to minimise the detected delay. This will also correct for any differential delay introduced by any radio-frequency filtering that may be present in the supply line, such as C1.

Figure 3:
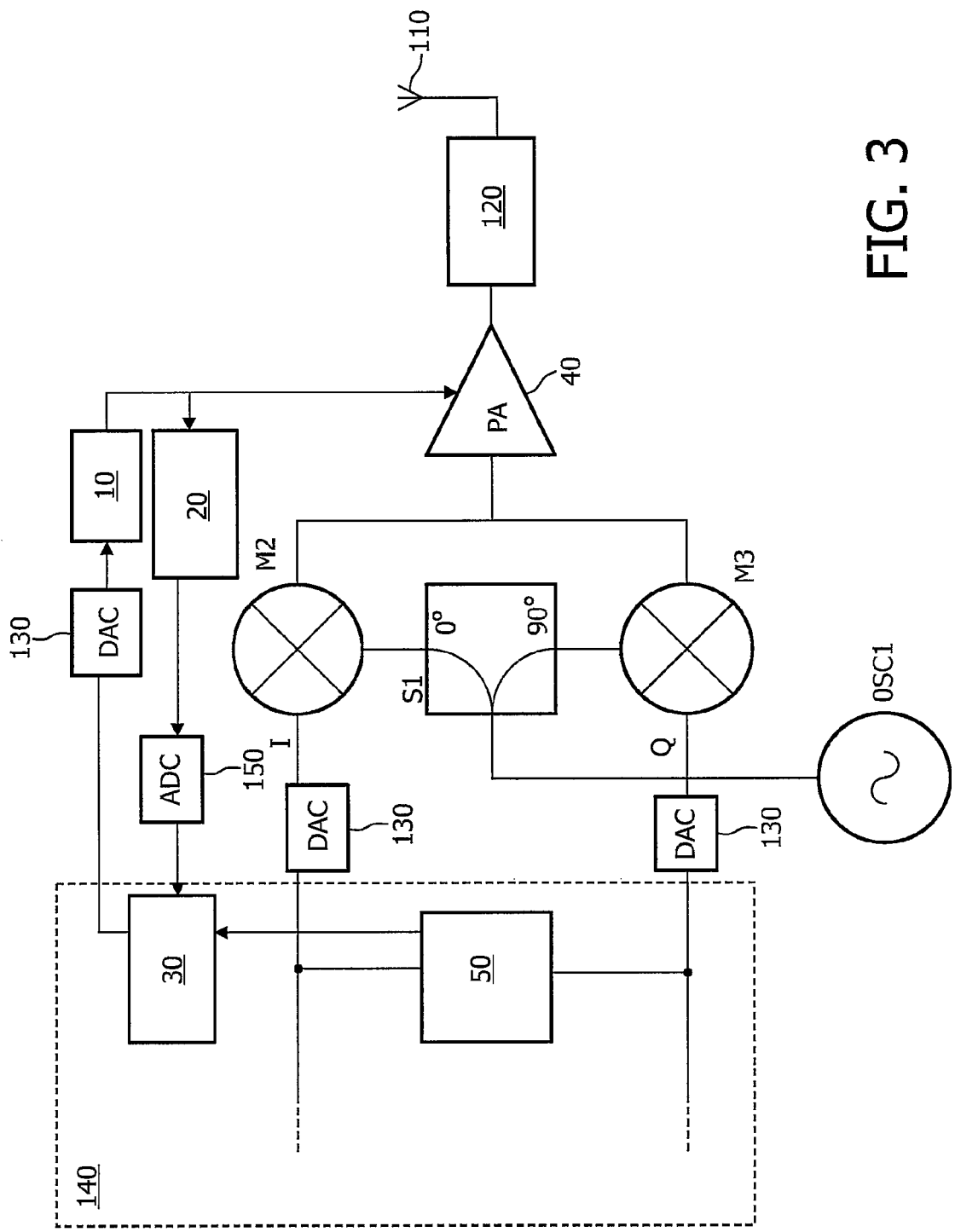
FIG. 3 shows a device having a transmitter according to another embodiment.

FIG. 3 shows a schematic view of another embodiment in the form of circuitry for a mobile device. In this case, the power amplifier 40 is coupled to an antenna 110 via a matching network 120. These can be implemented following conventional principles. The input signal is in the form of a digital complex signal having I and Q components. These are fed to digital-to-analogue converter (DAC) parts 130 for conversion to analogue form. The envelope extractor part 50 uses the digital I and Q signals as an input. Optionally the input may be taken from after the DAC parts, and the envelope extractor 50 implemented in analogue circuitry. The delay adjuster 30 is also in the digital domain in this example, with a DAC 130 to convert its output to an analogue signal for input to the controller 10. Optionally the delay adjuster 30 can be in the analogue domain, with a DAC at its input, as desired.

A baseband digital processor 140 can be provided to implement any signal processing before conversion to RF and power amplification for driving the antenna. This can be implemented using conventional digital circuitry such as an ASIC (application specific integrated circuit), DSP (digital signal processor) or other devices. The I and Q outputs are fed to mixers M2 and M3 respectively for mixing with a local oscillator signal derived from oscillator OSC1 and a splitter S1. This produces an oscillator signal at 0 degrees for mixer M2, and an oscillator signal at 90 degrees for mixer M3. The outputs of the mixers M2 and M3 are combined following established principles and fed to the power amplifier 40. There may be delays in the DACs 130, the mixers M2 and M3, and the various stages of the power amplifier 40, which contribute to the relative delay between the power amplifier current drawn, and the controlled supply voltage.

Figure 4:
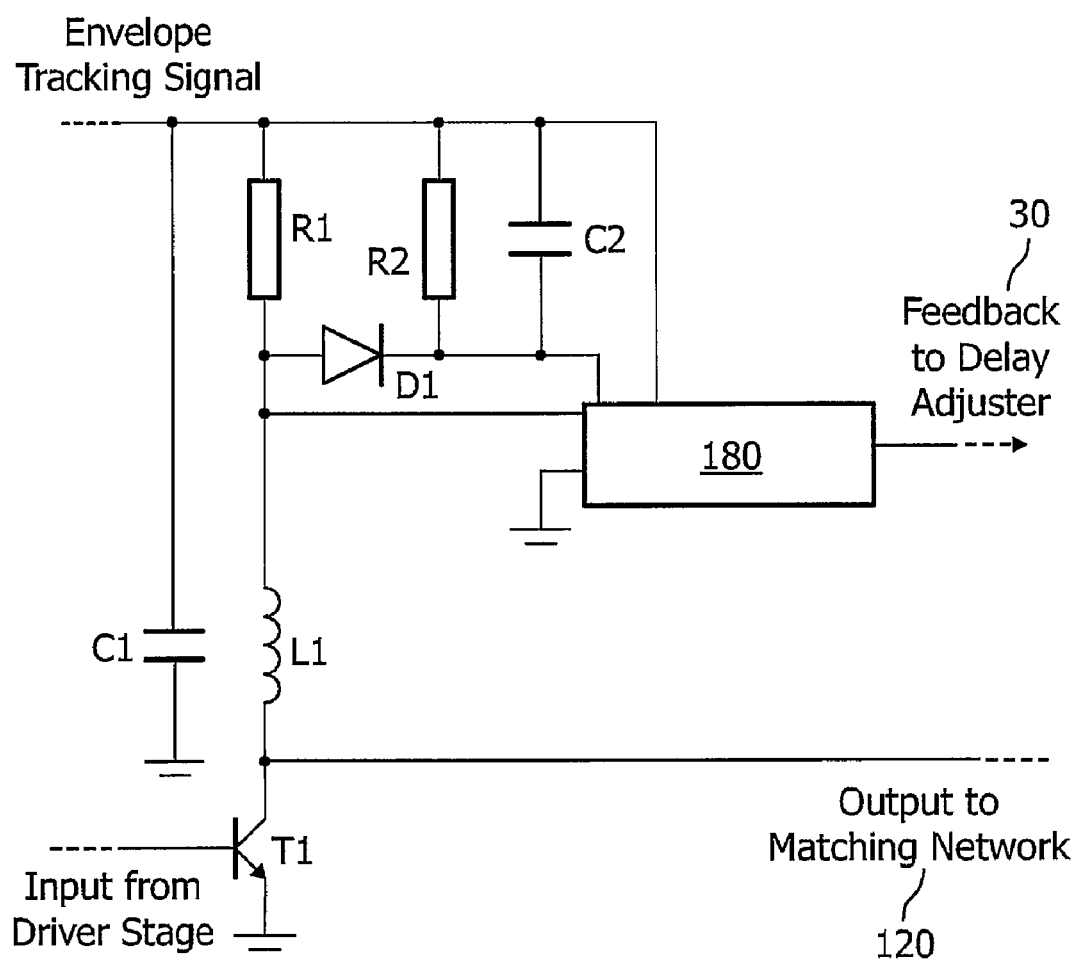
FIG. 4 shows a delay detector having a correlator, according to another embodiment.

Better compensation performance may be obtained, particularly when the spectrum of the amplitude component of the fully-modulated signal does not contain any significant spectral lines, by using a correlator rather than a multiplier and integrator. FIG. 4 shows an example of a delay detector 20 using a correlator 180. The correlator 180 can be implemented in analogue or digital circuitry, following established practice. There is no need for a low pass filter at its output, so R3 and C3 can be dispensed with. A correlator operates by effectively comparing or multiplying together numerous versions of its inputs each with a different relative delay, then determining which of the relative delays produces the highest output, and in some cases interpolating between the relative delays to find the peak with more precision. Hence there is usually no indication of sign in the output, so some other method is needed to determine a sign of the detected delay or to carry out the adjusting without needing such sign information.

In FIG. 4, an example of a rectifier is shown by the diode D1 in the path between the node where the sensing resistor R1 meets inductor L1, and an input to the delay detector 20 in the form of the correlator 180. The rectifier also has a resistor R2 and capacitor C2 in parallel across the output of the sensing resistor R1 and between the inputs to the correlator 180. The rectifier is not normally needed unless the power amplifier 40 is in pure class A operation, as discussed above. In this case, the RF should be allowed to leak across the sensing resistor R1, so the capacitor C1 is now coupled to the top end of R1 in FIG. 4. This may lead to some loss of efficiency, and the layout of the components of the sensor and detector may have to be arranged carefully to try to minimise unwanted effects.

The embodiments of the invention have been conceived in the context of the transmitter in cellular radio handsets targeted at the 2.5G and 3G standards. It is of potential application to any transmitter in which envelope tracking is used. Such wireless communication systems can include systems using frequency division multiple access (FDMA), time division multiple access (TDMA), and various spread spectrum techniques for example. One common spread spectrum technique used in wireless communications is code division multiple access (CDMA) signal modulation. GSM systems use a combination of TDMA and FDMA modulation techniques. Wireless communication devices incorporating wireless technology can include cellular radiotelephones, PCMCIA cards incorporated within portable computers, personal digital assistants (PDAs) equipped with wireless communication capabilities, and the like.

As has been described, the transmitter can have a frequency converter (M1, M2) for converting the input signal to an RF input signal, where the power amplifier 40 is an RF amplifier. In principle it is applicable to any amplifier, not just RF amplifiers. The power amplifier 40 can have a driver stage and an output stage (T1), the current drawn being that drawn by the output stage. Of course more stages could be used. The power amplifier 40 can be operable in a linear mode or a saturated mode, or in other hybrid modes. The sensor can have a series resistor (R1) in series with a collector or drain of the power amplifier, though any type of current sensor can be used, including magnetic field sensors for example. The sensor can have a rectifier (D1, R2, C2) to determine an envelope modulation in the current drawn, if necessary, for example when the amplifier is in pure class A operation. The delay detector can be arranged to detect a phase difference between the envelope amplitude modulation of the controlled supply voltage and the envelope modulation of the current drawn. It can have multiplier (M1) arranged to multiply the envelope modulations, or a correlator (180) for correlating the envelope modulations. The multiplier can use simpler circuitry, and the correlator can be more accurate. Any other delay detector can be used.

The sensor for sensing the current drawn can sense the current directly or indirectly, for example by sensing other parameters which vary strongly with modulation of current drawn. For example input voltage or input current to the output stage can be used as an indirect way of sensing current drawn, but these would exclude delay contributed by the final stage and so would be less accurate.

In the present specification and claims the word "a" or "an" preceding an element does not exclude the presence of a plurality of such elements. Further, the word "comprising" does not exclude the presence of other elements or steps than those listed.

The inclusion of reference signs in parentheses in the claims is intended to aid understanding and is not intended to be limiting.

From reading the present disclosure, other modifications will be apparent to persons skilled in the art. Such modifications may involve other features which are already known in the art of signal amplification and which may be used instead of or in addition to features already described herein.

The invention claimed is:

1. A transmitter having a power amplifier arranged to amplify an input signal having at least some amplitude modulation, a supply voltage controller arranged to control a supply voltage of the power amplifier according to an envelope of the input signal, and a delay adjuster for compensating a relative delay between the input signal and the controlled supply voltage according to a delay detected by a delay detector, wherein the transmitter has a sensor for sensing a modulation of a current drawn by the power amplifier, and the delay detector is arranged to detect a delay of the controlled supply voltage relative to the sensed modulation of current.

2. The transmitter of claim 1, the power amplifier having a driver stage and an output stage, the current drawn being that drawn by the output stage.

3. The transmitter of claim 1, the sensor having a series resistor in series with any of a collector or drain or emitter or source of the power amplifier, not being in an output path of the power amplifier.

4. The transmitter of claim 1, the delay detector being arranged to detect a phase difference between the envelope modulation of the controlled supply voltage and an envelope modulation of the current drawn.

5. The transmitter of claim 4, the delay detector having a multiplier arranged to multiply the envelope modulations.

6. The transmitter of claim 4 having a correlator for correlating the envelope modulations.

7. The transmitter of claim 1, having a rectifier to extract the envelope modulation from the sensor output.

8. The transmitter of claim 1, the power amplifier being operable in a linear mode.

9. The transmitter of claim 1, the power amplifier being operable in a saturated mode.

10. The transmitter of claim 1, having a frequency converter for converting the input signal to an RF input signal, and the power amplifier being an RF amplifier.

11. An integrated circuit having the transmitter of claim 1.

12. A battery powered mobile device having the transmitter or integrated circuit of claim 1.

13. A method of operating a transmitter having the steps of amplifying an input signal having at least some amplitude modulation using a power amplifier, controlling a supply voltage of the power amplifier according to the envelope of the input signal, and compensating a relative delay between the input signal and the controlled supply voltage according to a delay detected by a delay detector, the method having the steps of sensing a modulation of a current drawn by the power amplifier, and detecting a delay of the controlled supply voltage relative to the sensed modulation of current.

* * * * *